(12) United States Patent
Yoshikawa et al.

(10) Patent No.: US 9,970,109 B2
(45) Date of Patent: May 15, 2018

(54) SUBSTRATE PROCESSING METHOD AND SUBSTRATE PROCESSING APPARATUS

(71) Applicant: Tokyo Electron Limited, Tokyo (JP)

(72) Inventors: Jun Yoshikawa, Miyagi (JP); Motoshi Fukudome, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/178,824

(22) Filed: Jun. 10, 2016

(65) Prior Publication Data

US 2016/0362789 A1 Dec. 15, 2016

(30) Foreign Application Priority Data

Jun. 15, 2015 (JP) ................. 2015-120040

(51) Int. Cl.
| | |
|---|---|
| *H01L 21/461* | (2006.01) |
| *C23C 16/455* | (2006.01) |
| *C23C 16/458* | (2006.01) |
| *H01J 37/32* | (2006.01) |
| *H01L 21/02* | (2006.01) |

(52) U.S. Cl.
CPC .... *C23C 16/45551* (2013.01); *C23C 16/4584* (2013.01); *C23C 16/45542* (2013.01); *H01J 37/32715* (2013.01); *H01J 37/32779* (2013.01); *H01L 21/0228* (2013.01); *H01L 21/02164* (2013.01); *H01L 21/02274* (2013.01); *H01J 2237/3323* (2013.01)

(58) Field of Classification Search
CPC .......... H01L 21/02274; H01L 21/0228; H01L 21/02617; H01L 21/67276; C23C 16/45551; C23C 16/4584; C23C 16/45544
USPC .......................................... 438/782; 118/730
See application file for complete search history.

(56) References Cited

U.S. PATENT DOCUMENTS

| | | | |
|---|---|---|---|
| 2008/0125899 A1* | 5/2008 | Numakura | ........ H01L 21/67253 700/112 |
| 2010/0055297 A1* | 3/2010 | Kato | ................. C23C 16/45551 427/8 |
| 2010/0102030 A1* | 4/2010 | Kondoh | ............ H01L 21/67778 216/58 |
| 2014/0109833 A1* | 4/2014 | Ito | ..................... H01L 21/02617 118/730 |

FOREIGN PATENT DOCUMENTS

JP 07-249580 A 9/1995

* cited by examiner

*Primary Examiner* — Brook Kebede
(74) *Attorney, Agent, or Firm* — Abelman, Frayne & Schwab

(57) ABSTRACT

Disclosed is a substrate processing method including: placing a plurality of substrates on a rotary table in a processing container; and performing a processing on the substrates while rotating the rotary table. A dummy workpiece is disposed in a gap between the substrates placed on the rotary table.

16 Claims, 6 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2015-120040 filed on Jun. 15, 2015 with the Japan Patent Office, the disclosure of which is incorporated herein in its entirety by reference.

TECHNICAL FIELD

The present disclosure relates to a substrate processing method and a substrate processing apparatus in which a plurality of substrates are placed on a rotary table in a processing container and a processing is performed on the substrates while rotating the rotary table.

BACKGROUND

When a thin film is formed on a substrate, for example, a semiconductor wafer (hereinafter, referred to as a "wafer"), conventionally, a rotary table is provided in a processing container to be rotatable around a vertical axis, a plurality of wafers are placed on the rotary table, and a film formation processing is performed while rotating the rotary table. For example, in a case of atomic layer deposition (ALD), a plurality of gases, each reacting with the surfaces of the plurality of wafers, are supplied in sequence, so that a plurality of layers of reaction products are laminated, thereby forming a thin film. According to the method, since the film formation can be performed on a plurality of wafers at the same time, the production efficiency is good, as compared with a single wafer method. Furthermore, since the film formation is performed on respective wafers while rotating the rotary table, a uniform film formation processing is enabled for respective wafers.

However, the present inventors have found that profiles between respective wafers are certainly uniform, but there is still a problem about the in-plane film thickness uniformity of the wafers. This will be described with reference to FIGS. 8 and 9. For example, in a case where five wafers 102 are placed at regular intervals in the circumferential direction on a rotary table 101 that rotates around an axis P as a rotation center, it has been confirmed that, for example, even though radical components for film formation are supplied uniformly on the rotary table 101, the film thickness tens to increase in both end portions in the radial direction connecting the rotation center of the rotary table 101 and the center of the wafer 102, as compared with the center of the wafer 102.

As illustrated in FIG. 9, in a case of a bare wafer, there is not much difference in film thickness between the center of the bare wafer and both end portions in the radial direction. However, in a case of a patterned wafer, the film thickness in both end portions in the radial direction is larger than that in the center of the wafer. Further, in FIG. 9, the term "Center", as illustrated therein, refers to a central end portion of the rotary table 101 in the radial direction connecting a wafer center PW and the axis P serving as the rotation center of the rotary table 101, and the term "Edge" refers to an outer end portion of the wafer in the radial direction.

The reason is that, when a processing is performed while rotating the rotary table 101 as illustrated in FIG. 8, the amount of the radical components consumed is generally increased in the center of each wafer 102, as compared with both end portions in the radial direction, so that the center eventually becomes thinner, and the adhesion amount per hour of the radical components per area is decreased in the center. And, it is not a serious problem in the case of the bare wafer. However, in the case of the patterned wafer, since a minute unevenness based on the pattern is formed on the surface of the wafer, the reaction area is ten times wider than the case of the bare wafer, so that the difference in consumption amount becomes remarkable.

In this regard, when the film formation processing is performed on a plurality of wafers on the rotary table at the same time, as a technique for improving the uniformity of the film thickness in each wafer, it has been suggested to arrange an annular temperature control unit in a periphery of the wafer (see Japanese Patent Laid-Open Publication No. 07-249580).

SUMMARY

The present disclosure provides a substrate processing method including: placing a plurality of substrates on a rotary table in a processing container; and processing the substrates while rotating the rotary table. A dummy workpiece is disposed in a gap between the substrates placed on the rotary table. A distance from a center of the dummy workpiece to a center of the rotary table is different from a distance from a center of at least one of the substrates to the center of the rotary table.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
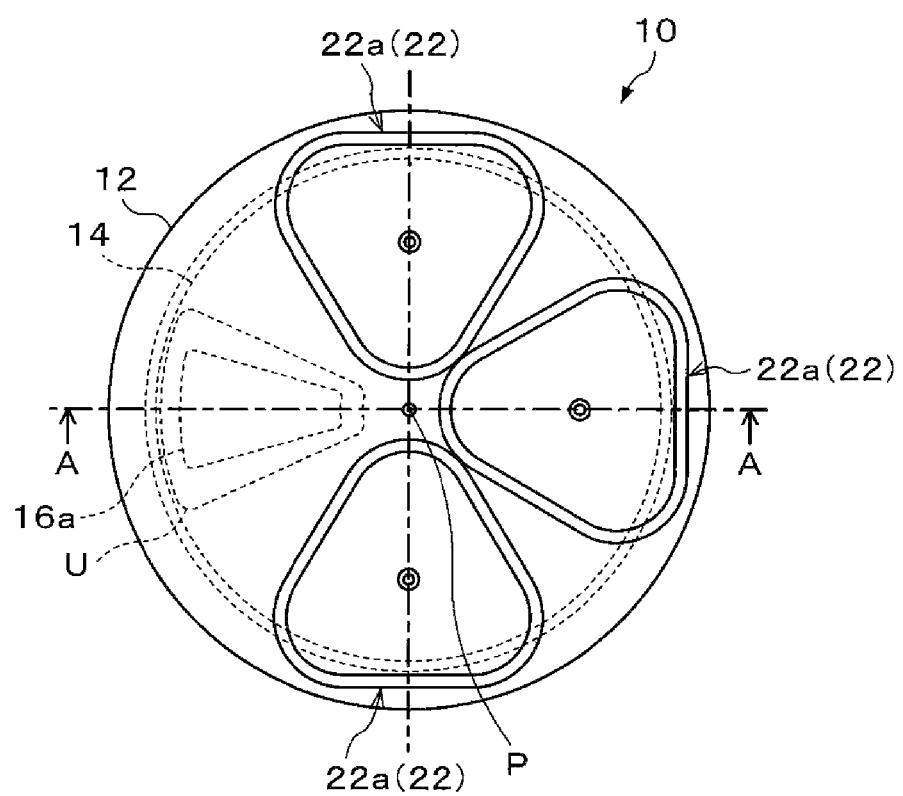
FIG. 1 is a schematic plan view illustrating a configuration of a substrate processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The technique described in Japanese Patent Laid-Open Publication No. 07-249580 is to enhance the uniformity of the film to be formed by controlling the in-plane temperature of respective wafers. However, is the technique has a problem in that it is impossible to directly cope with a non-uniformity of the film thickness caused by the difference in consumption amount of film formation species between the center of the wafer and both end portions in the radial direction as described above. Further, it is difficult to solve the problem by controlling a flow of a gas or plasma distribution in response to the non-uniformity.

The present disclosure has been made in consideration of the above circumstance, and an object of the present disclosure is to enhance the processing uniformity by attaching film formation species or active species of the processing such as, for example, radical components uniformly to the center and both end portions of each wafer in the radial direction connecting the rotation center of the rotary table and the wafer center, when the film formation processing is performed on a plurality of wafers on the rotary table at the same time.

In order to achieve the above object, the present disclosure provides a substrate processing method including: placing a plurality of substrates on a rotary table in a processing container; and processing the substrates while rotating the rotary table. A dummy workpiece is disposed in a gap between the substrates placed on the rotary table. A distance from a center of the dummy workpiece to a center of the rotary table is different from a distance from a center of at least one of the substrates to the center of the rotary table.

According to the present disclosure, since the dummy workpiece is disposed in the gap between the substrates placed side by side on the rotary table, film formation species or radical components, for example, in the film formation processing are consumed on the substrates, as well as on the dummy workpiece. Therefore, when the processing is performed while rotating the rotary table, the non-uniformity of the film thickness due to the conventional difference in consumption amount may be improved in both end portions in the radial direction toward the center of the substrate placed on the rotary table and the rotation center.

A surface of the workpiece may be made of a material that is equal to that of a surface of the substrate.

A pattern may be formed on the surface of the workpiece.

Furthermore, at least the workpiece may be disposed in a toric (ring-shaped) region formed between trajectories traced by a point closest to the substrate from a rotation center of the rotary table and a point farthest from the substrate, when rotating the rotary table.

The present disclosure provides a substrate processing apparatus including a processing container; and a rotary table provided within a processing container and configured to place a plurality of substrates thereon such that the substrates are processed while rotating the rotary table. A dummy workpiece is disposed in a gap between the substrates placed on the rotary table. A distance from a center of the dummy workpiece to a center of the rotary table is different from a distance from a center of at least one of the substrates to the center of the rotary table.

Also in this case, a surface of the workpiece may be made of a material that is equal to that of a surface of the substrate.

In addition, a pattern may be formed on the surface of the workpiece.

Furthermore, at least the workpiece may be disposed in a toric (ring-shaped) region formed between trajectories traced by a point closest to the substrate from a rotation center of the rotary table and a point farthest from the substrate, when rotating the rotary table.

According to the present disclosure, it is possible to enhance the processing uniformity by attaching film formation species or active species of the processing such as, for example, radical components uniformly to the center and both end portions of each wafer in the radial direction connecting the rotation center of the rotary table and the wafer center, when the film formation processing is performed on a plurality of wafers on the rotary table at the same time.

Figure 2:
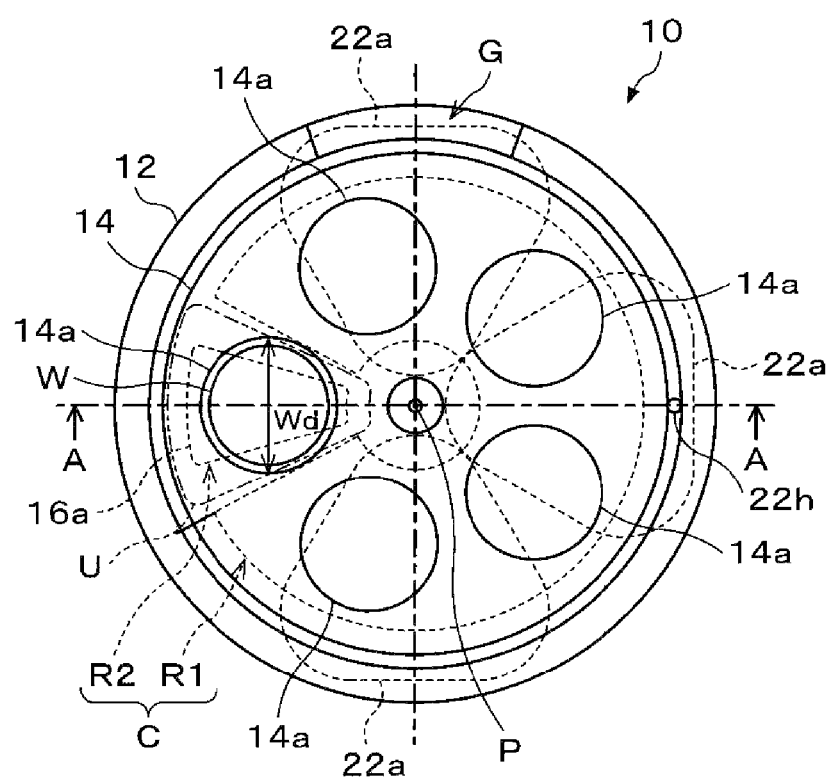
FIG. 2 is a plan view illustrating the substrate processing apparatus illustrated in FIG. 1 in a state where an upper member of a processing container is removed therefrom.
Figure 3:
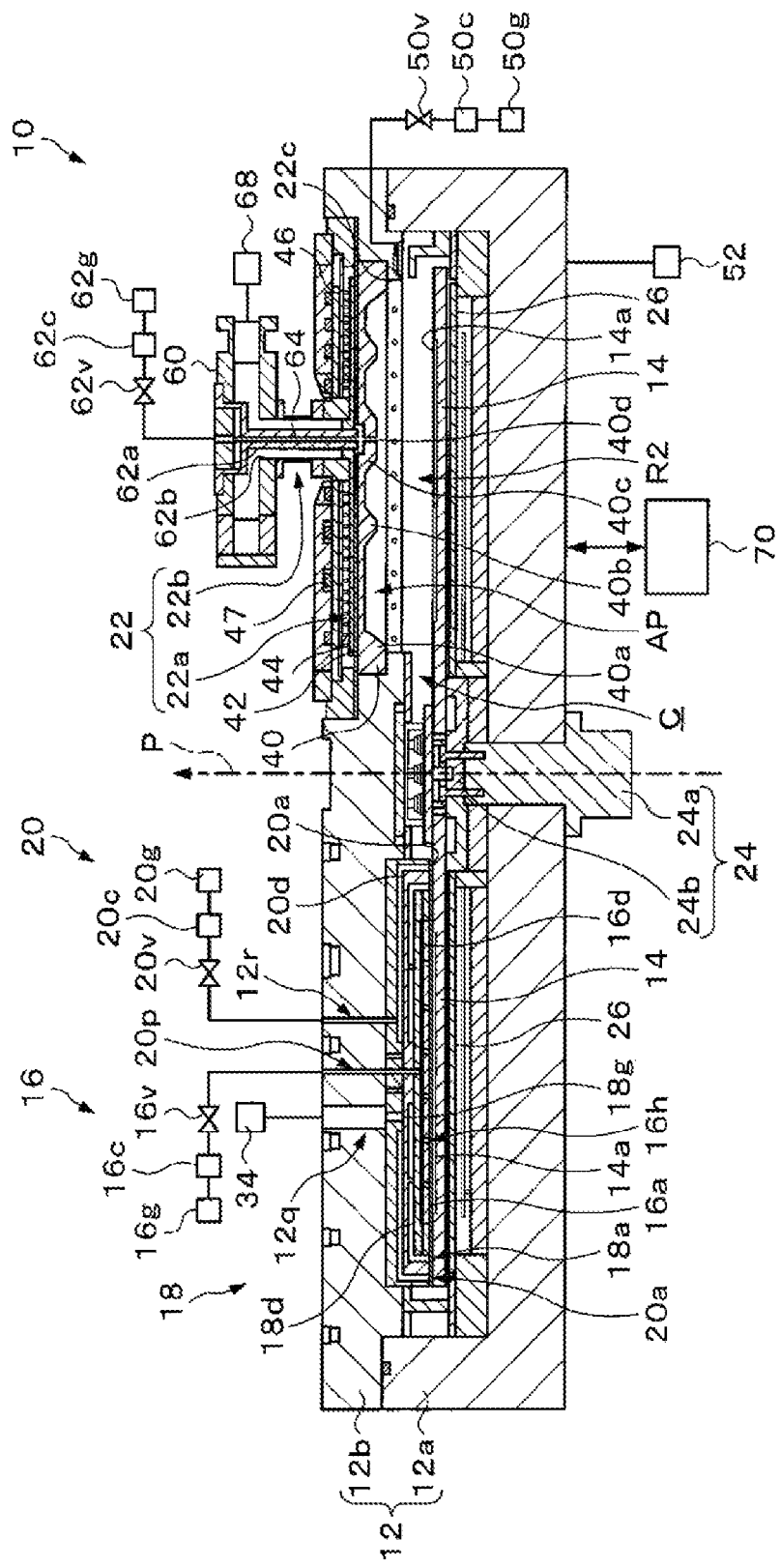
FIG. 3 is a cross-sectional view of the substrate processing apparatus, taken along line A-A as illustrated in FIGS. 1 and 2.

Hereinafter, an exemplary embodiment of the present disclosure will be described. FIG. 1 is a schematic plan view illustrating a configuration of a substrate processing apparatus according to an exemplary embodiment. FIG. 2 is a plan view illustrating the substrate processing apparatus 10 illustrated in FIG. 1 in a state where the upper member of a processing container 12 is removed therefrom. FIG. 3 is a cross-sectional view of the substrate processing apparatus 10, taken along line A-A as illustrated in FIGS. 1 and 2. The substrate processing apparatus 10 is configured as a plasma enhanced atomic layer deposition (PEALD) type apparatus which promotes a reaction by plasma.

As illustrated in FIG. 1, the processing container 12 of the substrate processing apparatus 10 is a substantially cylindrical container with an axis P in its center. The processing container 12 has a processing chamber C provided therein. The processing chamber C includes a unit U provided with an injection part 16a. The processing container 12 is made of a metal such as, for example, aluminum (Al) the inner surface of which is anodized or subjected to a plasma-resistant treatment such as, for example, yttrium oxide ($Y_2O_3$) spray treatment. The substrate processing apparatus 10 includes a plurality of plasma generating sections 22 in the processing chamber 12. Each plasma generating section 22 is provided with antennae 22a above the processing chamber 12 to output microwaves. The number of antennae 22a is not limited to that illustrated in FIG. 1, but may be appropriately selected.

As illustrated in FIG. 2, the substrate processing apparatus 10 includes a rotary table 14 having a plurality of substrate placement regions 14a on its top surface. The rotary table 14 is a substantially disc-shaped member with the axis P as a central axis. On the top surface of the rotary table 14, a plurality of (five in the example of FIG. 2) substrate placement regions 14a are formed concentrically about the axis P such that wafers W are placed singly therein. The wafers W are placed in the substrate placement regions 14a, and when the rotary table 14 is rotated, the placement regions 14a support the wafers W such that the wafers W are not dislocated. Each substrate placement region 14a is a substantially circular recess which is substantially the same shape as the substantially circular wafer W. A diameter Wd of the recess of the substrate placement region 14a is substantially the same as the diameter of the wafer W to be placed in the substrate placement region 14a. More specifically, the diameter Wd of the recess of the substrate placement region 14a may be set such that the placed wafer W is fitted in the recess and the wafer W is fixed so as not to be moved from the fitted position by a centrifugal force even when the rotary table 14 is rotated.

A gate valve G is provided in an outer periphery of the processing container 12 to carry the wafer W into the processing chamber C and carry the wafer W out of the processing chamber C through a conveyance device such as, for example, robot arm. Further, as illustrated in FIG. 2, an exhaust port 22h is formed below the outer periphery of the rotary table 14. The exhaust port 22h is connected with an exhaust device 52. The substrate processing apparatus 10 may control the operation of the exhaust device 52 such that the pressure in the processing chamber C is maintained at a desired pressure.

As illustrated in FIG. 3, the processing container 12 includes a lower member 12a and an upper member 12b. The lower member 12a has a substantially cylindrical shape which is top-opened, and includes a recess defined by a sidewall and a bottom wall, to define the substantially annular processing chamber C. The upper member 12b has a substantially cylindrical shape, and serves as a cover that closes the upper opening of the recess of the lower member 12a to define the processing chamber C. An elastic sealing member such as, for example, an O-ring may be provided in the outer periphery between the lower member 12a and the upper member 12b to seal the processing chamber C.

The rotary table 14 is provided within the processing chamber C defined by the processing container 12. The rotary table 14 is rotationally driven around the axis P by a driving mechanism 24. The driving mechanism 24 is provided with a driving device 24a such as, for example, a motor, and a rotary shaft 24b, and attached to the lower member 12a of the processing container 12.

The rotary shaft 24b extends to the inside of the processing chamber C with the axis P as its central axis. The rotary axis 24b rotates around the axis P by a driving force transmitted from the driving device 24a. A central portion of the rotary table 14 is supported by the rotary shaft 24b. Accordingly, the rotary table 14 is rotated around the axis P in accordance with the rotation of the rotary shaft 24b. Further, an elastic sealing member such as, an O-ring, may be provided between the lower member 12a of the processing container 12 and the driving mechanism 24 to seal the processing chamber C.

A heater 26 is provided below the rotary table 14 inside the processing chamber C to heat the wafer W placed in the substrate placement region 14a. The wafer W is heated by heating the rotary table 14 by the heater 26. The wafer W is conveyed to the processing chamber C through the gate valve G provided in the processing container 12 by a conveyance device such as, for example, a robot arm (not illustrated), placed in the placement region 14a, and taken out from the processing chamber C by the conveyance device through the gate valve G.

The processing chamber C forms a first region R1 arranged on the circumference about the axis P (see FIG. 2), and a second region R2. The wafer W placed in the substrate placement region 14a sequentially passes through the first region R1 and the second region R2 in accordance with the rotation of the rotary table 14.

A first gas supply section 16 is disposed to face the top surface of the rotary table 14. The first gas supply section 16 is provided with the injection part 16a. Among the regions included in the processing chamber C, the region facing the injection part 16a is the first region R1.

The injection part 16a is provided with a plurality of injection ports 16h. The first gas supply section 16 supplies a precursor gas to the first region R1 through the plurality of injection ports 16h. As the precursor gas is supplied to the first region R1, atoms or molecules of the precursor gas are chemically adsorbed onto the surface of the wafer W passing through the first region R1. The precursor gas is, for example, dichlorosilane (DCS), monochlorosilane, or trichlorosilane.

An exhaust port 18a of the exhaust section 18 is provided above the first region R1 to face the top surface of the rotary table 14. The exhaust port 18a is provided around the ejection part 16a. The exhaust section 18 exhausts the gas in the processing chamber C through the exhaust port 18a by operation of an exhaust device 34 such as, for example, a vacuum pump.

An injection port 20a of the second gas supply section 20 is provided above the first region R1 to face the top surface of the rotary table 14. The injection port 20a is provided around the exhaust port 18a. The second gas supply section 20 supplies a purge gas to the first region R1 through the injection port 20a. The purge gas supplied by the second gas supply section 20 is an inert gas such as, for example, argon (Ar). When the purge gas is injected to the surface of the wafer W, the excessive atoms or molecules chemically adsorbed onto the wafer W (residue gas components) are removed from the wafer W. Accordingly, an atomic layer or a molecular layer formed of chemically-adsorbed atoms or molecules of the precursor gas is formed on the surface of the wafer W.

The substrate processing apparatus 10 includes a unit U including the injection part 16a, the exhaust port 18a, and the ejection port 20a. That is, the injection part 16a, the exhaust port 18a, and the injection port 20a are formed as a part constituting the unit U. The unit U is attached to the processing unit 12 to come into contact with the bottom surface of the upper member 12b of the processing container 12.

A gas supply path 12p is formed in the upper member 12b of the processing container 12. The gas supply path 12p is connected with a gas source 16g of the precursor gas via a valve 16v and a flow rate controller 16c such as, for example, a mass flow controller. Further, the lower end of the gas supply path 12p is connected to a space 16d. The space 16d is connected with the injection ports 16h of the injection part 16a.

A gas supply path 12r is formed in the upper member 12b of the processing container 12. The gas supply path 12r is connected with a gas source 20g of the precursor gas via a valve 20v and a flow rate controller 20c such as, for example, a mass flow controller. The lower end of the gas supply path 12r passes through a space 20d, and the lower end functions as the injection port 20a.

The upper end of an exhaust path 18q is connected to an exhaust path 12q provided in the upper member 12b of the processing container 12. The exhaust path 12q is connected to the exhaust device 34 such as, for example, a vacuum pump. The exhaust path 18q passes through a space 18d.

When the purge gas is injected from the injection port 20a, the purge gas is exhausted from the exhaust port 18a along the surface of the rotary table 14. Thus, the precursor gas supplied to the first region R1 is suppressed from leaking out of the first region R1. Further, since the purge gas is exhausted from the injection port 20a and the purge gas is exhausted from the exhaust port 18a along the surface of the rotary table 14, reaction gas or radicals of the reaction gas to be supplied to the second region R2 are suppressed from entering into the first region R1. That is, in the substrate processing apparatus 10, the first region R1 and the second region R2 are separated atmospherically by the injection of the purge gas from the second gas supply section 20 and the exhaust of the purge gas from the exhaust section 18.

The substrate processing apparatus 10 includes the plasma generating section 22 in an opening AP of the upper member 12b, which is provided above the second region R2, to face the top surface of the rotary table 14. The plasma generating section 22 is provided with an antenna 22a and a coaxial waveguide 22b that supplies microwaves and the reaction gas to the antenna 22a. The upper member 12b includes, for example, three openings AP formed therein, and the substrate processing apparatus 10 includes, for example, three plasma generating sections 22 as illustrated in FIG. 1.

Each plasma generating section 22 generates plasma of the reaction gas in the second region R2 by supplying the reaction gas and the microwaves to the second region R2. When a nitrogen-containing gas is used for the reaction gas, the plasma generating section 22 may nitride the atomic layer or the molecular layer chemically adsorbed onto the wafer W. The reaction gas may be a nitrogen-containing gas such as, for example, nitrogen ($N_2$) or ammonia ($NH_3$).

In the plasma generating section 22, the antenna 22a is air-tightly arranged to close the opening AP. The antenna 22a is provided with a top plate 40, a slot plate 42, a slow wave plate 44, and a cooling plate 46. The upper plate 40 is a member in a substantially equilateral triangle shape with rounded corners, which is made of a dielectric such as, for example, alumina ceramic. The top plate 40 is supported by the upper member 12b such that the bottom surface thereof is exposed from the opening AP formed in the upper member 12b of the processing container 12 to the second region R2. On the bottom surface of the top plate 40, a first rib 40a is formed along the outer periphery of the top plate 40, and furthermore, a substantially circular second rib 40b is formed inside thereof. A protrusion 40c is formed at the inner side of the second rib 40b to protrude downwardly, and an injection port 40d is formed in a substantial center of the protrusion 40c to pass therethrough in the thickness direction.

On the bottom surface of the top plate 40, an unevenness is formed by the first rib 40a and the second rib 40b, but the bottom surface of the top plate 40 may be a flat surface. Accordingly, it is possible to enhance the adhesion of the coating film formed on the bottom surface of the top plate 40 in order to suppress any contamination.

The slot plate 42 is disposed on the top surface of the top plate 40. The slot plate 42 is a plate-like metal member which is formed in a substantially equilateral triangle shape with rounded corners. The slot plate 42 includes an opening at a position overlapping with the injection port 40d of the top plate 40 in the direction of the axis P. Further, the slot plates 42 include a plurality of slot pairs. Each slot pair includes two slot holes that are orthogonal to or intersecting with each other. The slot pairs are arranged in concentric circles which are radially spaced away from each other, in a circumferential direction in the plane of the slot plate 42.

The slow wave plate 44 is provided on the top surface of the top plate 42. The slow wave plate 44 is a member in a substantially equilateral triangle shape with rounded corners, which is made of a dielectric such as, for example, alumina ceramic. The slow wave plate 44 includes a substantially cylindrical opening to dispose an outer conductor 62b of the coaxial waveguide 22b.

The cooling plate 46 is provided on the top surface of the slow wave plate 44. The cooling plate 46 cools the antenna 22a via the slow wave plate 44 by a coolant flowing through a flow path formed therein. The surface of the cooling plate 46 is made of metal. A pressing part 47 is provided on the cooling plate 46 to press the entire surface or a plurality of portions of the cooling plate 46 against the slow wave plate 44. The pressing part 47 may be configured using a spring such as, for example, a spiral spring gasket.

The cooling plate 46, the slow wave plate 44, and the top plate 40 are brought into close contact with each other by a pressing force of the pressing part 47. Therefore, even though the top plate 40 is going to be deformed by the atmospheric pressure or heat from the plasma, the cooling plate 46, the slow wave plate 44, the slot plate 42, and the top plate may remain in close contact. As a result, the antenna 22a may efficiently radiate heat through the cooling plate 46. Further, deformation of the antenna 22a is suppressed by the heat radiation of the antenna 22a through the cooling plate 46. And, as deformation of the slot plate is suppressed, the variation of the electromagnetic field distribution formed by the microwaves radiated into the second region R2 is suppressed.

The coaxial waveguide 22b is provided with a substantially cylindrical hollow inner conductor 62a and a substantially cylindrical hollow outer conductor 62b. The inner conductor 62a penetrates the opening of the slow wave plate 44 and the opening of the slot plate 42 from the upper side of the antenna 22a. A space 64 in the inner conductor 62a is communicated with the injection port 40d of the top plate 40. Further, the upper end of the inner conductor 62a is connected with a gas source 62g of the reaction gas via a valve 62v and a flow rate controller 62c such as, for example, a mass flow controller. The reaction gas supplied from the valve 62v to the coaxial waveguide 22b is supplied to the second region R2 through the space 64 in the inner conductor 62a and the injection port 40d of the top plate 40. The gas source 62g is provided with, for example, Ar gas for plasma excitation.

The substrate processing apparatus 10 includes a waveguide 60 and a high frequency wave generator 68. The high frequency wave generator 68 generates high frequency waves included in a band of, for example, 1 MHz to 3 THz. In the exemplary embodiment, the high frequency wave generator 68 generates microwaves included in a frequency band of 300 MHz to 3 THz (e.g., microwaves of 2.45 GHz). The microwaves generated by the high frequency wave generator 68 are propagated to the coaxial waveguide 22b through the waveguide 60, and propagated through the gap between the inner conductor 62a and the outer conductor 62b. Then, the microwaves propagated in the slow wave plate 44 is propagated from the slot holes of the slot plate 42 to the top plate 40, and radiated from the top plate 40 to the second region R2.

Further, in the second region R2, the reaction gas is also supplied from reaction gas supply units 22c. A plurality of reaction gas supply units 22c are provided inside the upper member 12b of the processing container 12, and disposed around, for example, an opening AP. Each reaction gas supply unit 22c injects the reaction gas toward the lower side of the top plate 40. Each reaction gas supply unit 22c is connected with a gas source 50g of the reaction gas via a valve 50v and a flow rate controller 50c such as, for example, a mass flow controller.

The plasma generating section 22 supplies the reaction gas to the second region R2 by the injection port 40d of the top plate 40 and an injection part 50b of the reaction gas supply unit 22c, and radiates the microwaves to the second region R2 by the antenna 22a. Therefore, plasma of the reaction gas is generated in the second region R2.

Further, as illustrated in FIG. 3, the substrate processing apparatus 10 includes a controller 70 to control respective components of the substrate processing apparatus 10. The controller 70 may be a computer including a control device such as, for example, a central processing unit (CPU), a storage device such as, a memory, and an input/output device. The controller 70 controls respective components of the substrate processing apparatus 10 by the operation of the CPU in accordance with a control program stored in the memory.

The controller 70 transmits a control signal that controls the rotation speed of the rotary table 14, to the driving device 24a. Further, the controller 70 outputs a control signal that controls the temperature of the wafer W, to a power source connected to the heater 26. Further, the controller 70 outputs a control signal that controls the flow rate of the precursor gas, to the valve 16v and the flow rate controller 16c. Further, controller 70 transmits a control signal that controls the exhaust amount of the exhaust device 34 connected to the exhaust port 18a, to the exhaust device 34.

Further, the controller 70 transmits a control signal that controls the flow rate of the purge gas, to the valve 20v and the flow rate controller 20c. Further, the controller 70 transmits a control signal that controls the power of the microwaves, to the microwave generator 68. Further, the controller 70 transmits a control signal that controls the flow rate of the reaction gas, to the valve 50v, the valve 62v, the flow rate controller 50c, and the flow rate controller 62c. Further, the controller 70 transmits a control signal that controls the exhaust amount from the exhaust port 22h, to the exhaust device 52.

Figure 4:
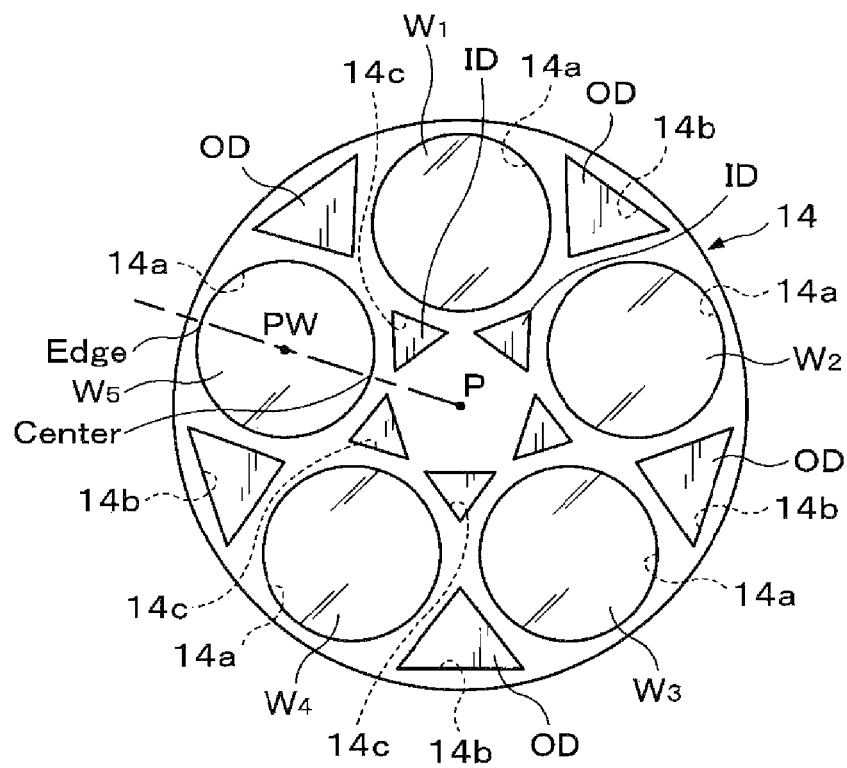
FIG. 4 is a plan view of a rotary table of the substrate processing apparatus of FIG. 1.

And, as illustrated in FIG. 4, slots 14b, 14c serving as dummy workpiece accommodating recesses are formed in a gap between the substrate placement regions 14a, 14a on the rotary table 14, which is a rotating table. The slots 14b are arranged at five positions on the outer peripheral side of the rotary table 14 at regular intervals in the circumferential direction. The slots 14c are arranged at five positions on the inner peripheral side of the rotary table 14 at regular intervals in the circumferential direction. In the present exemplary embodiment, all the slots 14b, 14c have an isosceles triangular shape in a plan view, and the slots 14c are smaller than the slots 14b. Of course, the shape of the slots 14b, 14c is not limited to such a triangular shape, but may be any shape.

And, each slot 14b accommodates a dummy workpiece OD having the same shape and size as the slot 14b, and each slot 14c accommodates a dummy workpiece ID having the same shape and size as the slot 14c. In the present exemplary embodiment, since film-forming target wafers $W_1$ to $W_5$ are silicon wafers, the material of the dummy workpieces OD, ID are also equally made of silicon. In addition, since the film-forming target wafers $W_1$ to $W_5$ have a pattern formed on the surface, the dummy workpieces OD, ID having a pattern formed on the surface are used. In addition, as illustrated in FIG. 4, a distance from a center of any one of the dummy workpieces OD, ID accommodated in the slots 14b, 14c to a center of the rotary table 14 is different from a distance from a center of at least one of the wafers $W_1$ to $W_5$ to the center of the rotary table 14.

The substrate processing apparatus 10 according to the exemplary embodiment is configured as described above. As for the wafers $W_1$ to $W_5$, descriptions will be made on a process for forming, for example, SiN on a surface. First, a precursor, which is DCS, is supplied to the first region R1 by the first gas supply section 16. Thus, Si contained in the precursor gas is chemically or physically adsorbed onto the wafer W.

Subsequently, the wafer W passes through the first region R1 and the second region R2 in accordance with the rotation of the rotary table 14. At this time, the wafer W is exposed to the purge gas supplied by the second gas supply section 20. Accordingly, the precursor gas containing Si excessively chemically adsorbed onto the wafer W is removed from the surface of the wafer W.

Further, the wafer W moves into the second region R2 in accordance with the rotation of the rotary table 14. In the second region R2, the plasma generating section 22 supplies the reaction gas to the second region R2, and supplies microwaves to the second region R2. Therefore, plasma of the reaction gas is generated in the second region R2. In this example, in order to nitride the precursor gas chemically adsorbed onto the wafer W, a nitrogen-containing gas such as, for example, $N_2$ gas, $NH_3$ gas, NO, or $NO_2$ is used as the reaction gas. The precursor gas chemically adsorbed onto the surface of the wafer W is nitrided by the plasma of the reaction gas.

As such, the wafer W is subjected to a processing step by the precursor gas, a purge step, and a nitriding step repeatedly by the rotation of the rotary table 14. Therefore, a silicon oxide film is formed on the wafer W. Further, concurrently, the wafers $W_1$ to $W_5$ are sequentially and repeatedly processed.

And, at the time of the film formation processing, the film formation processing is performed on the wafers $W_1$ to $W_5$ on the rotary table 14, as well as on the surfaces of the dummy workpieces OD, ID. That is, the first supplied radicals are supplied to the surfaces of the wafers $W_1$ to $W_5$, as well as the surfaces of the dummy workpieces OD, ID placed on the slots 14b, 14c, and consumed. Thus, while the rotary table 14 is rotated, radicals of the same level per unit area are attached to the wafers $W_1$ to $W_5$ on the rotary table 14 and the surfaces of the dummy workpieces OD, ID, and even when supplying the reaction gas after the subsequent purge, film formation species of the same level per unit area are attached thereto. Therefore, the film thicknesses in the radial direction in the plane of the wafers $W_1$ to $W_5$, that is, the film thicknesses of "Center" and "Edge" in FIG. 4 become equal, and thus, the uniformity of the film thickness in the radial direction is enhanced.

Figure 5:
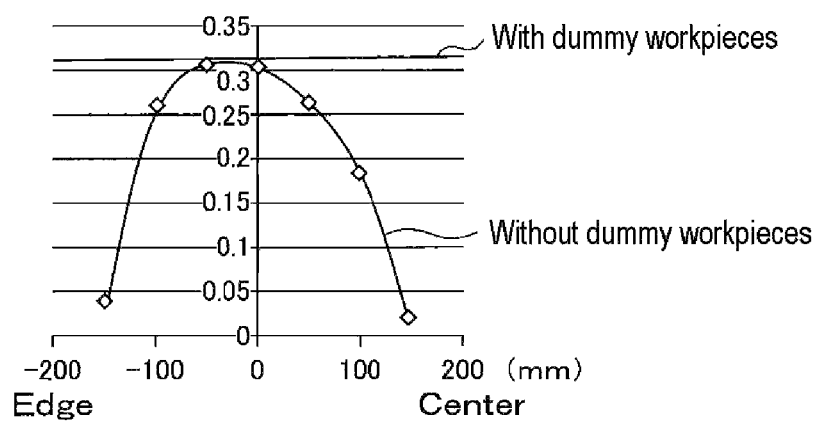
FIG. 5 is a graph illustrating a consumption amount of radicals on the wafer in the radial direction in the presence or absence of a dummy workpiece.

FIG. 5 is a graph illustrating a consumption amount of radicals on the wafer in the radial direction in the presence or absence of the dummy workpieces OD, ID. In the absence of the dummy workpieces OD, ID, the consumption amount of the radicals in both end portions of the wafer is smaller than that in the central portion of the wafer. However, in a case where the dummy workpieces OD, ID are set, the consumption amount of the radicals is at the same level in both end portions and the center, and becomes flat in general.

Figure 6:
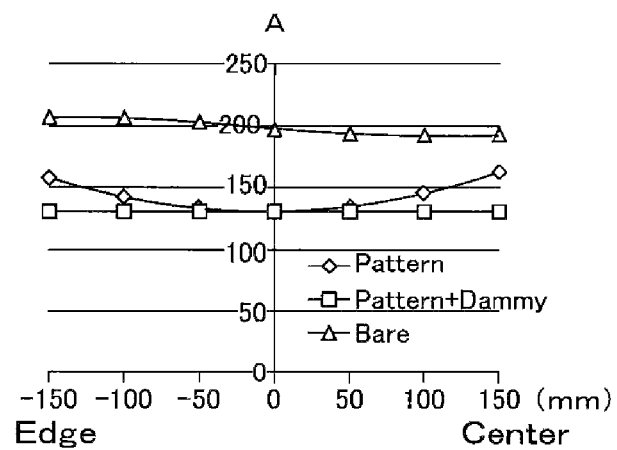
FIG. 6 is a graph illustrating a distribution of film thicknesses of each wafer in the radial direction connecting the center of the rotary table and the center of the wafer in a case where only a bare wafer is used, a case in which only a patterned wafer is used, and a case in which a dummy workpiece is used together with a patterned wafer.

And, under such a background, a distribution of film thicknesses in the radial direction connecting the center of the rotary table 14 of each wafer and the substrate center in a case where only a bare wafer is used (without a dummy workpiece), a case where only a patterned wafer is used (without a dummy workpiece), and a case where a dummy workpiece is used together with a patterned wafer, is illustrated in FIG. 6.

As can be seen form the result, in the case where only the bare wafer is used, the deposition rate tends to decrease slightly in a direction from the outer peripheral end portion (Edge) of the rotary table 14 in the wafer to the central end portion (Center) of the rotary table 14. However, in the case where only the patterned wafer is used (without a dummy workpiece), the deposition rate tends to decrease in a direction from "Edge" and "Center," which are both end portions of the rotary table 14, to the center of the wafer. On the contrary, in the case where the dummy workpieces OD, ID are used together with the patterned wafer, a substantially flat characteristic is obtained. Therefore, in the case where the dummy workpieces OD, ID are used together with the patterned wafer, that is, in the case where the film formation processing by PEALD is performed using the substrate processing apparatus 10 according to the exemplary embodiment, the uniformity of the film thickness in the wafer is enhanced.

Figure 7:
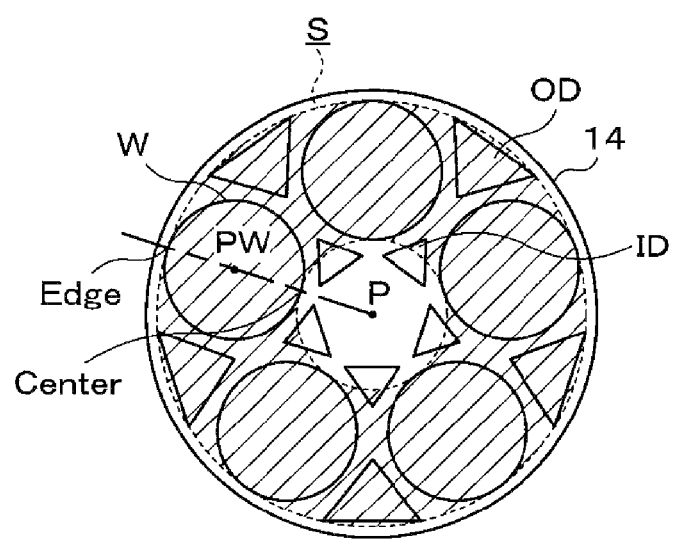
FIG. 7 is an explanatory view illustrating a disposition region of the dummy workpiece disposed on the rotary table.
Figure 8:
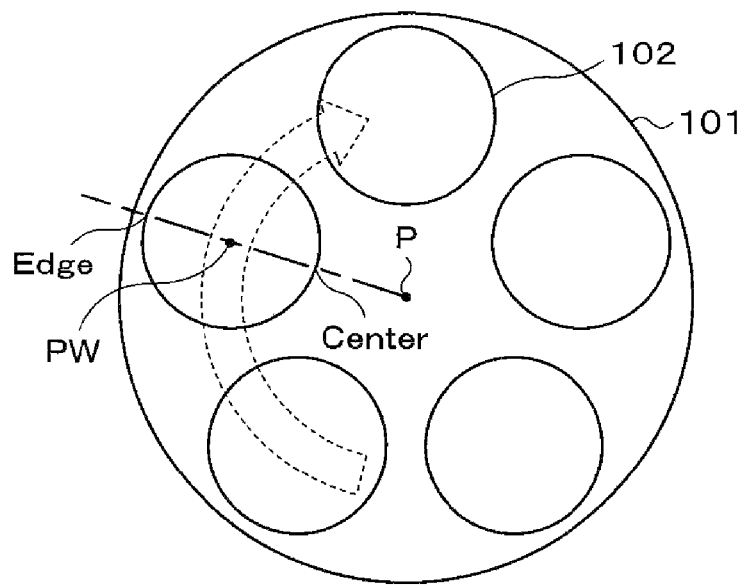
FIG. 8 is a plan view of a rotary table of a conventional substrate processing apparatus.
Figure 9:
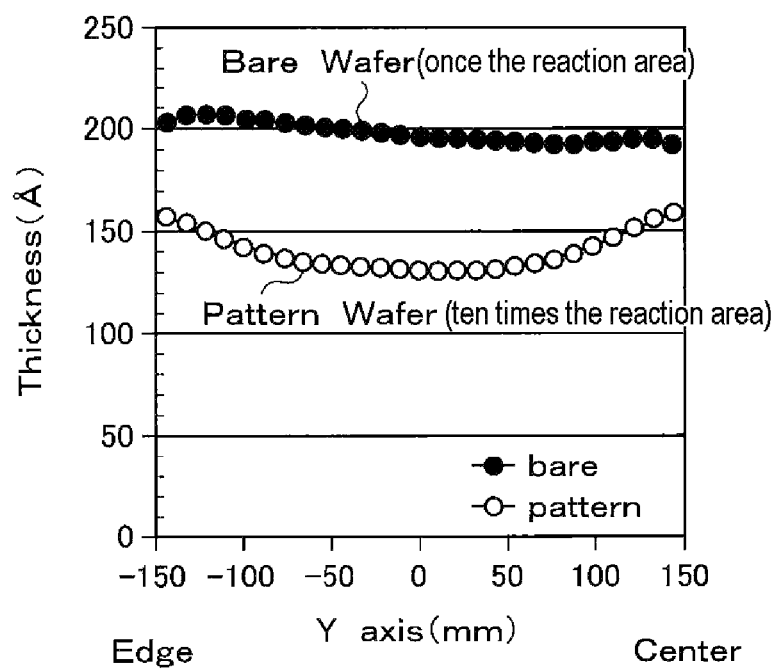
FIG. 9 is a graph illustrating the film thickness distribution in the bare wafer and the pattern wafer when a film formation processing is performed in the conventional substrate processing apparatus.

Further, as illustrated in FIG. 7, the dummy workpieces OD, ID may be disposed such that at least a part or all thereof extends in a toric region S formed between trajectories traced by the end portion (Center) at the rotation center side of the rotary table 14 of the wafer W and the end portion (Edge) radially opposite to the end portion (Center), when rotating the rotary table 14. That is, some or all of the dummy workpieces OD, ID may be disposed in the toric region S between a point closest to the placed wafer W and a point farthest from a rotation center P of the rotary table 14. Further, either of the outer peripheral dummy workpiece OD and the inner peripheral dummy workpiece ID may be disposed depending on the situation. In addition, in a case of providing both, the surface patterns may be equal to or different from each other in density.

The above-described exemplary embodiment was a PEALD type film formation processing, but not limited thereto. The present disclosure is also applicable to an ALD type film formation processing by gas and heat, furthermore, various plasma processings. The plasma source may be a remote plasma type that generates plasma outside the processing container. The processing container used in the exemplary embodiment was a pressure-reducible vacuum container, but may be a processing container which performs a processing under an atmospheric pressure. Further, the number of substrates placed on the rotary table may be arbitrarily selected as necessary.

Further, in the above-described exemplary embodiment, patterns are formed on the surfaces of the dummy workpieces OD, ID, but the deposition rate may be controlled in the radial direction by changing the density or the surface area of the patterns. Further, the material of the surfaces of the dummy workpieces OD, ID may not necessarily be the same as that of the processing target wafer.

In the above-described exemplary embodiment, a wafer was used as the substrate, but not limited thereto. The substrate may be a glass substrate, and the shape of the substrate may not be circular but rectangular.

The present disclosure is useful for a batch type substrate processing in which a plurality of substrates are placed on a rotary table provided in a processing container, and subjected to a processing at the same time.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
    placing a plurality of substrates on a rotary table in a processing container; and
    processing the substrates while rotating the rotary table, wherein a dummy workpiece is disposed in a gap between the substrates placed on the rotary table, and wherein a distance from a center of the dummy workpiece to a center of the rotary table is different from a distance from a center of at least one of the substrates to the center of the rotary table.

2. The substrate processing method of claim 1, wherein the dummy workpiece is made of a same material as that of a surface of the substrate.

3. The substrate processing method of claim 1, wherein a wiring pattern is formed on a surface of the dummy workpiece.

4. The substrate processing method of claim 1, wherein at least the dummy workpiece is disposed in a toric region formed between trajectories traced by a point closest to the substrate from a rotation center of the rotary table and a point farthest from the substrate, when rotating the rotary table.

5. The substrate processing method of claim 1, wherein the dummy workpiece has a different shape from that of at least one of the substrates.

6. The substrate processing method of claim 5, wherein the dummy workpiece has a triangular shape.

7. The substrate processing method of claim 5, wherein the dummy workpiece has a isosceles triangular shape.

8. The substrate processing method of claim 1, wherein the dummy workpiece has a smaller size than at least one of the substrates.

9. A substrate processing apparatus comprising:
    a processing container; and
    a rotary table provided within the container and configure to place a plurality of substrates thereon such that the substrates are processed while rotating the rotary table, wherein a dummy workpiece is disposed in a gap between the substrates placed on the rotary table, and wherein a distance from a center of the dummy workpiece to a center of the rotary table is different from a distance from a center of at least one of the substrates to the center of the rotary table.

10. The substrate processing apparatus of claim 9, wherein the dummy workpiece is made of a same material as that of a surface of the substrate.

11. The substrate processing apparatus of claim 9, wherein a wiring pattern is formed on a surface of the dummy workpiece.

12. The substrate processing apparatus of claim 9, wherein at least the dummy workpiece is disposed in a toric region formed between trajectories traced by a point closest to the substrate from a rotation center of the rotary table and a point farthest from the substrate, when rotating the rotary table.

13. The substrate processing apparatus of claim 9, wherein the dummy workpiece has a different shape from that of at least one of the substrates.

14. The substrate processing apparatus of claim 13, wherein the dummy workpiece has a triangular shape.

15. The substrate processing apparatus of claim 13, wherein the dummy workpiece has a isosceles triangular shape.

16. The substrate processing method of claim 9, wherein the dummy workpiece has a smaller size than at least one of the substrates.

* * * * *